United States Patent [19]

Kojima

[11] 4,264,863

[45] Apr. 28, 1981

[54] PULSE SWALLOW TYPE PROGRAMMABLE FREQUENCY DIVIDING CIRCUIT

[75] Inventor: Tadashi Kojima, Yokosuka, Japan

[73] Assignee: Tokyo Shibaura Denki Kabushiki Kaisha, Kawasaki, Japan

[21] Appl. No.: 958,341

[22] Filed: Nov. 3, 1978

[30] Foreign Application Priority Data

Nov. 10, 1977 [JP] Japan .................. 52-134997

[51] Int. Cl.$^3$ ...................... H03K 23/26; H03K 21/36
[52] U.S. Cl. .................. 328/39; 307/225 R; 328/46
[58] Field of Search ........... 307/220 R, 225 R, 225 C; 328/39, 42, 46, 48

[56] References Cited

U.S. PATENT DOCUMENTS

| | | | |
|---|---|---|---|
| 3,375,448 | 3/1968 | Newman et al. | 328/46 X |
| 3,431,499 | 3/1969 | Godfrey | 328/46 X |
| 3,484,699 | 12/1969 | Israel | 328/48 X |
| 3,811,092 | 5/1974 | Charbonnier | 328/48 X |

OTHER PUBLICATIONS

"Dial any Channel to 500 Mhz", L. F. Blachowicz, Electronics, May 2, 1966 pp. 60-69.
IEEE Trans BTR-15 "A Digital Frequency Synthesizer For an AM and FM receiver,", J. Stinehelfer et al., pp. 235-243, Oct. 1969.

Primary Examiner—John Zazworsky
Attorney, Agent, or Firm—Cushman, Darby & Cushman

[57] ABSTRACT

A pulse swallow type programmable frequency dividing circuit is provided which comprises a prescaler for dividing the frequency of an input signal in the frequency division ratio of 1/K or 1/(K+1) according to the contents of a control signal supplied to a control terminal; a programmable frequency divider for dividing the frequency of an output signal from the prescaler in a preset frequency division ratio; and a control signal generating circuit producing a control signal to the control terminal of the prescaler in response to an output pulse from the programmable frequency-divider, thereby changing the frequency division ratio of the prescaler. A preset number of control pulses whose pulse width is equal to a period of an output pulse signal from the prescaler are supplied from the control signal generating circuit to the control terminal of the prescaler to set the frequency division ratio of the prescaler at 1/(K+1).

7 Claims, 17 Drawing Figures

PULSE SWALLOW TYPE PROGRAMMABLE FREQUENCY DIVIDING CIRCUIT

This invention relates to a swallow type programmable frequency dividing circuit.

Known to date is a digital frequency synthesizer type tuner provided with a phase locked loop PLL shown in FIG. 1. In the phase locked loop PLL, comparison is made by a phase comparator 15 between the phase of a referential signal delivered from a referential signal generator 11 and that of a signal issued from a voltage controlled oscillator 12 through a prescaler 13 and a programmable frequency divider 14. The phase comparator 15 sends forth an output signal corresponding to a phase difference between both compared signals to the voltage controlled oscillator 12 through a low-pass filter 16 to control the voltage controlled oscillator 12 so as to reduce a phase difference between both signals to zero. An output signal from the programmable frequency divider 14 is locked to a referential signal delivered from the referential signal generator 11. Where an output signal from the voltage controlled oscillator 12 is used as a local signal in a superheterodyne type tuner, then the tuner can act as a digital frequency synthesizer type. The frequencies of received signals are selected by presetting the frequency division ratio of the programmable frequency divider by an external presetting means.

When the phase locked loop PLL is set in a locked condition, then the following equation results:

$$fo = P \cdot N \cdot fr = (P \cdot fr)N$$

where:

fo = frequency of an output signal from the voltage controlled oscillator 12

P and N = frequency division ratios of the prescaler 13 and programmable frequency divider 14, respectively fr = frequency of a referential signal sent forth from the referential signal generator.

As apparent from the above equation, P·fr denotes the minimum degree of stepwise variation of the frequency of an output signal from the voltage-controlled oscillator 12 whose operation is controlled by an output signal from the programmable frequency divider 14. The elevation of the performance of the phase locked loop PLL has hitherto been subject to certain limitations. Followng is the reason. Though the frequency of a referential signal whose phase is compared is actually fr, yet a smallest possible degree of stepwise variation of frequency which admits of control is P fr. Moreover, since a low-pass filter 16 is not an ideal type, the voltage controlled oscillator 12 is affected by a noise signal. Further, since a low-pass filter 16 used is generally not an ideal type, the voltage controlled oscillator 12 is often affected by noises.

Accordingly, attempts have been made to develop a high speed programmable frequency divider. As a result, a pulse swallow type programmable frequency divider has been proposed. This frequency divider comprises a swallow counter 24-1 for counting output pulses from a 2-module prescaler 23 and issuing a control signal to the control terminal of the 2-module prescaler 23 when a count made by the counter 24-1 reaches a preset value A, thereby changing the frequency division ratio of the prescaler 24-2 counts output pulses from the prescaler 23 and produces an output pulse. When a count thus made reaches a preset value N, the swallow counter 24-1 is set at an initial operating condition. at an initial operating condition.

The swallow counter 24-1 sets the frequency division ratio of the prescaler 23 at (1/K+1), until an A number of output pulses from the prescaler 23 are counted, starting with, for example, the initial operating condition, and later at 1/K, until the swallow counter 24-1 is brought back to the original condition by an output signal from the programmable frequency divider 24-2.

The programmable frequency divider 24-2 generates an output pulse whose frequency $f_N$ is expressed by the following equation:

$$f_N = \frac{fo}{(K+1)A + K(N-A)} = \frac{fo}{KN + A}$$

It is seen from the above equation that the frequency division ratio of the programmable frequency divider 24-2 is 1/KN+A. Even where an input signal has a lower frequency than fo/K, the programmable frequency divider 24-2 can indeed reduce the minimum degree of stepwise variation of the frequency of an input signal to as small a value as 1/K.

However, a programmable frequency divider proposed to date has the drawbacks that the frequency division ratio of the prescaler 23 has to be changed during one cycle of an output pulse from the prescaler 23; it is necessary to limit the delay time allowed for a changeover signal issued from the swallow counter 24-1 (a period extending from a point of time at which the prescaler 23 generates an output pulse to a point of time at which the frequency division ratio of the prescaler 23 is changed in response to the output signal of the swallow counter 24-1) to a smaller interval than K/fo (sec); and where the prescaler 23 is carrying out frequency division at the rate of, for example (1/K+1), and the swallow counter 24-1 issues a control signal to the prescaler 23 when counting a prescribed number of pulses, then the frequency division ratio of (1/K+1) of the prescaler 23 has to be changed to the ratio of 1/K while a number of pulses from zero to K are counted; and it is extremely difficult to provide an MOS IC version of a programmable frequency divider which is demanded to change the frequency division ratio at the above-mentioned high speed.

It is accordingly the object of the invention to provide a pulse swallow type programmable frequency-dividing circuit which effectively divides the frequency of an input signal without the necessity of carrying out frequency division at an extremely high speed.

According to an aspect of this invention, there is provided a pulse swallow type programmable frequency dividing circuit comprising frequency-dividing means which divides the frequency of an input signal in the variable frequency division ratio corresponding to the contents of a control signal supplied to the control terminal of said frequency-dividing means; a programmable frequency dividing means for dividing the frequency of an output signal from the ratio variable frequency-dividing means in a preset frequency division ratio; and control signal-generating means for supplying a preset number of control signals each having a predetermined period to the control terminal of the ratio variable frequency-dividing means for carrying out frequency division in the variable ratio in response to an output signal from the programmable frequency-dividing means.

This invention can be more fully understood from the following detailed description when taken in conjunction with the accompanying drawings, in which.

Figure 3:
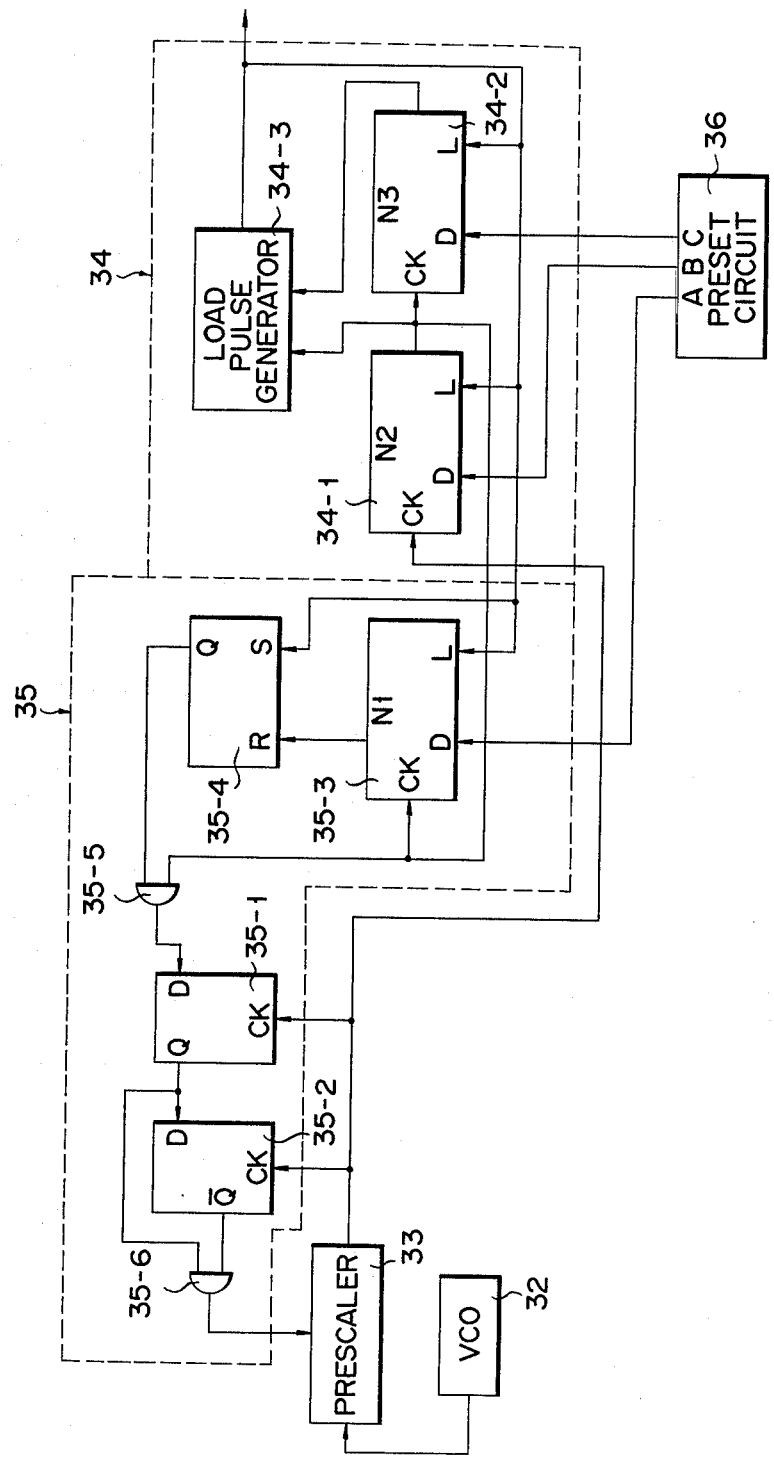
FIG. 3 shows the arrangement of a pulse swallow type programmable frequency dividing circuit embodying this invention.
Figures 6, 7A, 7B, 7C, 7D:
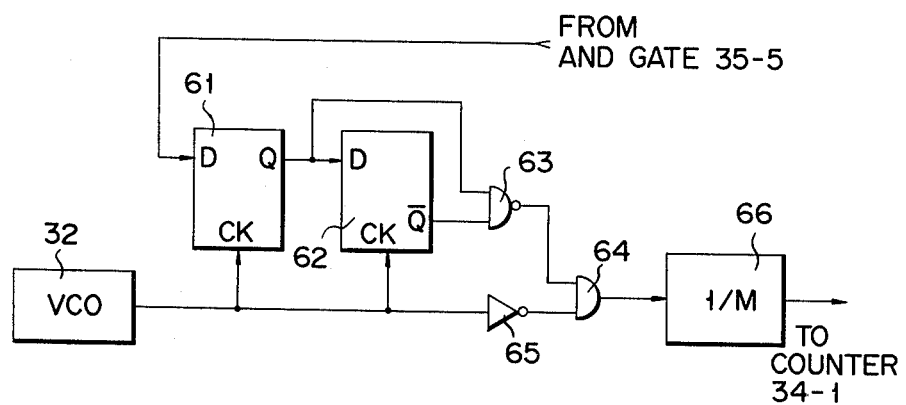

FIGS. 4A to 4C and FIGS. 5A to 5F set forth the waveforms of signals given for illustrating the operation of the frequency dividing circuit of FIG. 3 embodying the invention;

FIG. 6 shows a modification of the clock pulse-controlling unit of the present frequency-dividing circuit of FIG. 3; and FIGS. 7A to 7D set forth the waveforms of signals given for illustrating the operation of the modified clock pulse-controlling unit of FIG. 6.

There will now be described by reference to FIG. 3 a pulse swallow type programmable frequency dividing circuit embodying this invention. The frequency fo of an output signal from a voltage controlled oscillator 32 is divided by a prescaler 33 in the ratio of 1/K or (1/K+1). The output terminal of the prescaler 33 is connected to the clodk pulse input terminal of a first presettable counter 34-1 of, for example, the 10-scale type included in the programmable frequency divider 34, and also to the clock pulse input terminals of flip-flop circuits 35-1, 35-2 included in a control pulse-generator 35.

The programmable frequency divider 34 further includes a second presettable counter 34-2 for counting output pulses from the first presettable counter 34-1; and a load pulse generator for producing an output pulse when detecting that the first and second presettable counters 34-1, 34-2 have respectively counted a preset number of pulses.

The control pulse generator 35 further includes a presettable counter 35-3 which sends forth an output pulse to the reset terminal of a flip-flop circuit 35-4 when counting a preset number of output pulses from the first presettable counter 34-1 included in the programmable frequency divider 34. The Q output terminal of the flip-flop circuit 35-4 is connected to one input terminal of an AND gate 35-5, the other input terminal of which is connected to the output terminal of the first presettable counter 34-1, and whose output terminal is connected to the D input terminal of the first flip-flop circuit 35-1. The Q output terminal of the first flip-flop circuit 35-1 is connected to the D input terminal of the second flip-flop circuit 35-2 and also to one input terminal of an AND gate 35-6, the other input terminal of which is connected to the $\overline{Q}$ output terminal of the second flip-flop circuit 35-2 and whose output terminal is connected to the control terminal of the prescaler 33.

The data input terminals of the presettable counters 35-3, 34-1, 34-2 are connected to the corresponding data output terminals A, B, C of a preset circuit 36. When an output pulse from a load pulse generator 34-3 is supplied to the load input terminals of the presettable counters 35-3, 34-1, 34-2, then data N1, N2, N3 denoting first, second and third preset number of pulses are preset in the presettable counters 35-3, 34-1, 34-2. The set input terminal of flip-flop circuit 35-4 is connected to the output terminal of a load pulse generator 34-3, which is set in response to an output pulse from the load pulse generator 34-3.

There will now be described by reference to FIGS. 4 and 5 the operation of the programmable frequency dividing circuit of FIG. 3.

The frequency fo of a signal (FIG. 4A) delivered from the voltage-controlled oscillator 32 is divided by the prescaler 33 in the ratio corresponding to the contents of a control signal (FIG. 4B). Where, in this case, the control terminal of the prescaler 33 is supplied with a high level signal, then the prescaler 33 divides the frequency of an input signal in the ratio of (1/K+1), for example 1/11. Where the control terminal of the prescaler 33 receives a low level signal, then the prescaler 33 divides the frequency of an input signal in the ratio of 1/K, for example, 1/10, generating an output signal as shown in FIG. 4C.

FIG. 5A shows the waveform of an output pulse from the prescaler 33 expressed in a longer time unit than in FIG. 4C.

Assume now that in the initial stage of the present pulse swallow type programmable frequency dividing circuit, the flip-flop circuit 35-4 is set, and data denoting prescribed number of pulses delivered from the preset circuit 36 are preset in the presettable counters 35-3, 34-1, 34-2.

For example, each time the 10-scale presettable counter 34-1 counts down output pulses from the prescaler 33 to zero, the counter 34-1 sends forth one pulse shown in FIG. 5B. An output pulse from the presettable counter 34-1 is conducted to the presettable counters 35-3, 34-2 to count down the contents of the same. The output pulse from the presettable counter 34-1 is also supplied to the flip-flop circuit 35-1 through the AND gate 35-5. A high level signal received at the D input terminal of the flip-flop circuit 35-1 is shifted in response to a clock pulse supplied to the clock pulse input terminal of the flip-flop circuit 35-1, namely, an output pulse from the prescaler 33. An output signal shown in FIG. 5C from the Q output terminal of the flip-flop circuit 35-1 is conducted to the D input terminal of the flip-flop circuit 35-2. A high level signal supplied to the D input terminal of the flip-flop circuit 35-2 is shifted in response to a clock pulse supplied to the clock pulse input terminal of the flip-flop circuit 35-2. An output signal shown in FIG. 5D from the $\overline{Q}$ output terminal thereof is delivered to one input terminal of an AND gate 35-6, the other input terminal of which is supplied with an output signal from the Q output terminal of the flip-flop circuit 35-1. Accordingly, a pulse shown in FIG. 5E having a pulse width equal to one period of an output pulse from the prescaler 33 is supplied to the control terminal of the prescaler 33, thereby changing the frequency division ratio of the prescaler 33 to (1/K+1). After passage of the pulse, the frequency division ratio of the prescaler 33 is brought back to 1/K.

When counting an N1 number of preset pulses issued from the presettable counter 34-1, then the presettable counter 35-3 generates a reset signal as shown in FIG. 5F to reset the R-S flip-flop circuit 35-4. As the result, the AND gate 35-5 is disabled by a low level signal from the R-S flip-flop circuit 35-4, preventing an output pulse from the presettable counter 34-1 from being supplied to the flip-flop circuit 35-1. Later, when the contents of the presettable counter 34-1 are counted down to zero, and the presettable counter 34-2 counts an N3 number of pulses, then both presettable counters 34-1, 34-2 send forth an output signal to the load pulse generator 34-3 at the same time, which in turn produces an output pulse. Data N1, N2, N3 are set in the presettable counters 35-3, 34-1, 34-2 and the flip-flop circuit 35-4 is set, causing the subject programmable frequency divider to be brought back to the initial condition.

Each time the load pulse generator 34-3 or programmable frequency divider 34 sends forth one output pulse, the control terminal of the prescaler 33 is supplied with a pulse having a pulse width equal to one period of an output pulse signal from the prescaler 33, and also with pulses having a number corresponding to the data N1 preset in the presettable counter 35-3. Therefore, the frequency fo of an input signal to the prescaler 33 and the frequency $f_N$ of an output pulse from the programmable frequency divider 34 have a relationship expressed by the following equation:

$$fo = \{(10N3 + N2 - N1)K + N1(K + 1)\} f_N$$
$$= \{(10N3 + N2)K + N1\} f_N$$

Figure 1:
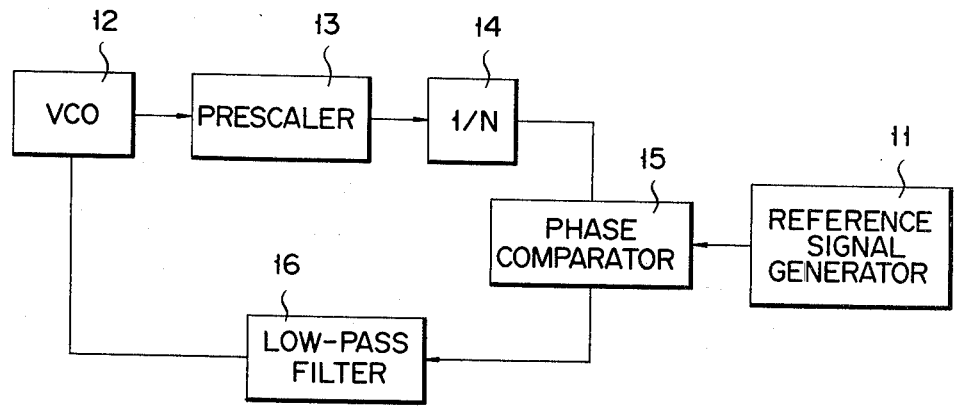
FIG. 1 is a block diagram of the prior art phase locked loop circuit.
Figure 2:
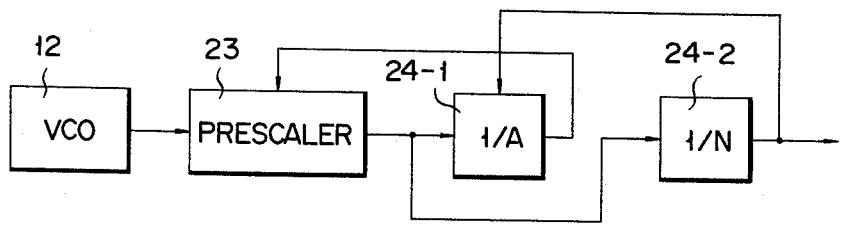
FIG. 2 is a block diagram of the prior art pulse swallow type programmable frequency dividing circuit.

This equation is equivalent to an equation showing relationship between the frequency of an input signal supplied to the prior art pulse swallow type programmable frequency dividing circuit of FIG. 2 and the frequency of an output signal sent forth therefrom.

As mentioned above, the frequency dividing circuit of this invention is so designed that the control pulse generator 35 is operated in response to an output pulse from the programmable frequency divider 34; and there are issued a preset number of pulses each having a pulse width equal to one period of an output signal from the prescaler 33 and set in synchronization with the output signal. Therefore, some delay occurring in the control pulse generator does not raise any problem.

There will now be described by reference to FIG. 6 a clock pulse-controlling circuit having the same function as a combination of the flip-flop circuits 35-1, 35-2, AND gate 35-6 and prescaler 33. This clock pulse-controlling circuit is operated in response to an output pulse from the AND gate 35-5 of the control pulse generator 35, and supplies to the programmable frequency divider 34 an output signal from the voltage-controlled oscillator 32 which is formed of a plurality of pulses, with one of the pulses omitted.

The clock pulse-controlling circuit of FIG. 6 includes a flip-flop circuit 61 whose D input terminal is connected to the output terminal of the AND gate 35-5; a flip-flop circuit 62 whose D input terminal is connected to the Q output terminal of the flip-flop circuit 61; a NAND gate 63, one input terminal of which is connected to the Q output terminal of the flip-flop circuit 61 and the other input terminal of which is connected to the $\overline{Q}$ output terminal of the flip-flop circuit 62; an AND gate 64, one input terminal of which is connected to the output terminal of the NAND gate 63 and the other input terminal of which is connected to the output terminal of the voltage-controlled oscillator 32 through an inverter 65; and a frequency divider 66 for dividing the frequency of an output pulse from the AND gate 64 in the ratio of 1/M and sending forth an output pulse to the counter 34-1 of the programmable counter 34 of FIG. 5.

There will now be described the operation of the clock pulse-controlling circuit of FIG. 6 by reference to FIGS. 7A to 7D showing the waveforms of signals. When a pulse having a relatively long pulse width as shown in FIG. 7B is supplied to the D input terminal of the flip-flop circuit 61, then this flip-flop circuit 61 issues an output pulse from the Q output terminal in response to a clock pulse (FIG. 7A) from the voltage-controlled oscillator 32. When the D input terminal of the flip-flop circuit 62 is supplied with an output pulse from the Q output terminal of the flip-flop circuit 61, then a low level signal is sent forth from the $\overline{Q}$ output terminal of the flip-flop circuit 62 in response to a clock pulse signal shown in FIG. 7A. As the result, an output signal as shown in FIG. 7C is delivered from the NAND gate 63, and the AND gate 64 issues a signal shown in FIG. 7D reversed from an output pulse signal shown in FIG. 7A from which one pulse is omitted, each time a pulse is delivered from the AND gate 35-5. When, therefore, a pulse is issued from the AND gate 35-5, the frequency divider 66 divides the frequency of an output signal from the voltage-controlled oscillator 32 substantially in the ratio of 1/M, generating an output pulse signal from which the same number of pulses are omitted as in an output pulse signal from the prescaler 33 of FIG. 3.

This invention has been described by reference to the foregoing embodiment. It will be understood, however, that the invention is not limited to this embodiment, with the programmable frequency-dividing circuit of FIG. 3, an output pulse from the presettable counter 34-1 was supplied to the counter 35-3 and AND gate 35-5. Instead, it is possible to provide a separate frequency divider for dividing the frequency of an output pulse from the prescaler 33 and supply an output pulse from the frequency divider to the presettable counter 35-3 and AND gate 35-5.

The frequency division ratio of the prescaler 33 of FIG. 3 was set at 1/K and (1/K+1). However, the frequency division ratio may be chosen to be 1/K and (1/K+n) (n is an integer of 2 or more).

What is claimed is:

1. A pulse swallow type programmable frequency dividing circuit comprising:
    means for generating a prescaler output signal having a frequency, a ratio of said prescaler output signal frequency and a frequency of an input signal applied to said generating means varying in accordance with control signals;
    programmable frequency dividing means for producing a first output signal each time a first predetermined number of prescaler output signals are detected and for producing a second output signal each time a second predetermined number of prescaler output signals are detected, said second predetermined number being greater than said first predetermined number, each period of time between successive second output signals defining one cycle; and
    control signal generating means for producing in each said cycle a third predetermined number of said control signals, said control signal generating means generating each of said control signals in response to said first output signal, each of said control signals having a predetermined period, said ratio varying in response to each of said control signals.

2. The pulse swallow type programmable frequency dividing circuit according to claim 1, wherein:
    said programmable frequency dividing means comprises a frequency divider for generating said first output signal; and said control signal generating means comprises a counter for counting output pulses from said frequency divider, and sending forth an output signal after counting said third predetermined number of pulses, a control circuit for generating an inhibit signal in response to an output signal from said counter and issuing an energization signal in response to an output signal from said programmable frequency dividing means, and a first AND gate which is connected at one input terminal to the output terminal of said frequency dividing means divider, connected at the other input terminal to the output terminal of the control circuit, and connected at the output terminal to said generating, and which is disabled by an inhibit signal delivered from said control circuit and is enabled by an energization signal from said control circuit.

3. The pulse swallow type programmable frequency dividing circuit according to claim 2, wherein said control circuit is formed of an R-S flip-flop circuit.

4. The pulse swallow type programmable frequency dividing circuit according to claim 2, wherein said counter is formed of a presettable counter in which prescribed data is preset in response to an output signal from the programmable frequency dividing means.

5. The pulse swallow type programmable frequency dividing circuit according to claim 2, 3, 4 wherein said generating means comprises:
a prescaler for supplying said prescaler output signal to the programmable frequency dividing means;
a first flip-flop circuit responsive to said prescaler output signal to generate an output signal corresponding to an output signal from said control signal generating means;
a second flip-flop circuit producing an output signal corresponding to an output signal from the first flip-flop circuit in response to said prescaler output signal; and
a second AND gate for receiving an output signal from the first flip-flop circuit and a signal reversed from an output signal from the second flip-flop circuit and supplying an output signal to the prescaler.

6. The pulse swallow type programmable frequency dividing circuit according to claim 5, wherein said first and second flip-flop circuits and second AND gate are operated in response to an output signal from the control signal generating means and sends forth a pulse having a pulse width equal to one period of said prescaler output signal.

7. The pulse swallow type programmable frequency dividing circuit according to claim 2, 3, 4 or, wherein said generating means comprises:
a first flip-flop circuit receiving an input signal and producing an output signal corresponding to an output signal from the control signal generating means;
a second flip-flop circuit producing in response to said input signal an output signal corresponding to an output signal from the first flip-flop circuit; a NAND gate for receiving an output signal from the first flip-flop circuit and a signal reversed from an output signal from the second flip-flop circuit;
a second AND gate for controlling a signal reversed from said input signal according to the contents of an output signal from the NAND gate; and
a frequency divider for dividing the frequency of an output signal from the second AND gate in the prescribed ratio and supplying an output signal to the programmable frequency dividing means.

* * * * *